US008587318B2

(12) United States Patent
Chandler et al.

(10) Patent No.: US 8,587,318 B2
(45) Date of Patent: Nov. 19, 2013

(54) SENSOR ARRANGEMENT FOR AN ENERGY STORAGE DEVICE AND A METHOD OF USING THE SAME

(75) Inventors: Andrew K. Chandler, Plymouth, MI (US); Andrew H. Leutheuser, Royal Oak, MI (US); Willard A. Blevins, Glendale, AZ (US); Larry J. Yount, Scottsdale, AZ (US)

(73) Assignee: GM Global Technology Operations LLC, Detroit, MI (US)

( * ) Notice: Subject to any disclaimer, the term of this patent is extended or adjusted under 35 U.S.C. 154(b) by 356 days.

(21) Appl. No.: 12/844,318

(22) Filed: Jul. 27, 2010

(65) Prior Publication Data

US 2012/0025835 A1      Feb. 2, 2012

(51) Int. Cl.
*G01N 27/416* (2006.01)

(52) U.S. Cl.
USPC .................................. 324/433; 320/116

(58) Field of Classification Search
USPC ............... 320/116–118, 120–126, 134, 136; 324/509, 510, 537, 500, 522
See application file for complete search history.

(56) References Cited

U.S. PATENT DOCUMENTS

| 7,807,289 | B2 | 10/2010 | Seiler et al. | |
| 8,164,341 | B2 * | 4/2012 | Jaeger et al. | 324/433 |
| 2010/0134068 | A1 * | 6/2010 | Lim | 320/116 |

FOREIGN PATENT DOCUMENTS

| DE | 202006009128 U1 | 10/2006 |
| DE | 102006061270 A1 | 6/2008 |
| EP | 2148384 A1 | 1/2010 |

OTHER PUBLICATIONS

German Office Action dated Mar. 4, 2013, (5 pages).

* cited by examiner

*Primary Examiner* — Arleen M Vazquez
*Assistant Examiner* — Alesa Allgood
(74) *Attorney, Agent, or Firm* — Lionel D. Anderson; Reising Ethington P.C.

(57) ABSTRACT

A sensor arrangement and method that may be used with a variety of different energy storage devices, including battery packs found in hybrid vehicles, battery electric vehicles, and other types of vehicles. Some battery monitoring systems, such as those designed to monitor and/or control lithium-ion battery packs, may require individual voltage readings for each and every cell. If a battery monitoring system component—even one that provides just one of these sensor readings—malfunctions or otherwise experiences a fault condition, then it may be necessary to bring the entire vehicle in for service. The exemplary sensor arrangement and method may be used to control a series of balancing switches in the sensor arrangement in such a way that enables the vehicle to detect fault conditions and to continue operating successfully in the event that such fault conditions occur.

22 Claims, 4 Drawing Sheets

SENSOR ARRANGEMENT FOR AN ENERGY STORAGE DEVICE AND A METHOD OF USING THE SAME

TECHNICAL FIELD

The present invention generally relates to a sensor arrangement and, more particularly, to a sensor arrangement that may be used with an energy storage device such as a vehicle battery.

BACKGROUND

Hybrid vehicles, battery electric vehicles, and other types of vehicles that use a battery for vehicle propulsion increasingly rely upon battery electronics for proper battery management and operation.

Battery electronics are oftentimes required to put in many hours of service in the field; sometimes, many more hours than is required of other electronic devices found in the vehicle. For example, a typical vehicle electronic module may see 8,000 hours of service over a 15 year period, while certain battery electronics may be required to put in 50,000 hours of service over the same amount of time. This type of increased demand can sometimes result in the battery electronics needing to be serviced or replaced at an accelerated rate.

In addition, certain battery electronics—such as sensors for monitoring battery voltage, current, temperature, etc.— are sometimes packaged and mounted within the actual battery pack. Thus, servicing and/or replacing such battery electronics can be difficult and expensive.

SUMMARY

According to one embodiment, there is provided a method of using a sensor arrangement with an energy storage device having a plurality of cells. The method may comprise the steps of: (a) providing a sensor arrangement having a plurality of balancing switches, wherein each of the balancing switches is connected to a cell; (b) causing the plurality of balancing switches to be in an 'off' state and then measuring the voltages for at least some of the plurality of cells; (c) switching the state of at least some of the plurality of balancing switches so that a first group of balancing switches is in an 'on' state and a second group of balancing switches is in an 'off' state, and then measuring the voltages for at least some of the plurality of cells; (d) switching the state of at least some of the plurality of balancing switches so that the first group of balancing switches is in an 'off' state and the second group of balancing switches is in an 'on' state, and then measuring the voltages for at least some of the plurality of cells; and (e) comparing the voltages from steps (b), (c) and (d) in order to determine if there is a fault condition.

According to another embodiment, there is provided a method of using a sensor arrangement with an energy storage device having a plurality of cells. The method may comprise the steps of: (a) providing a sensor arrangement having a plurality of balancing switches, wherein each of the balancing switches is connected to a cell; (b) determining if there is a fault condition with the energy storage device; and (c) if there is a fault condition with the energy storage device, then locating the fault condition and estimating a voltage for a first cell and a second cell, wherein the first and second cells are both connected to the fault condition.

DRAWINGS

Preferred exemplary embodiments will hereinafter be described in conjunction with the appended drawings, wherein like designations denote like elements, and wherein.

DETAILED DESCRIPTION

The sensor arrangement and method described below may be used with a variety of different energy storage devices, including battery packs found in hybrid vehicles, battery electric vehicles, and other types of vehicles. Such vehicles may also have battery electronics (e.g., a battery monitoring system) that monitor different cells or groups of cells within the battery pack. For instance, a battery monitoring system may keep track of the voltage, current, and/or temperature for dozens of different battery cells; this can result in hundreds or even thousands of sensor readings. Some battery monitoring systems, such as those designed to monitor and/or control lithium-ion battery packs, may require individual voltage readings for each and every cell. If a battery monitoring system component—even one that provides just one of these sensor readings—malfunctions or otherwise experiences a fault condition, then it may be necessary to bring the entire vehicle in for service.

The exemplary sensor arrangement and method described below, on the other hand, may enable the vehicle to continue operating successfully in the event that certain malfunctions occur; this can greatly reduce the cost associated with servicing and/or replacing the battery electronics. Although the following exemplary description is provided in the context of a vehicle battery pack, it should be appreciated that the method described herein may be used with a number of other applications. For instance, the method may be used with other types of energy storage devices like fuel cells, as well as energy storage devices found in aircraft, watercraft, military vehicles, lawn and garden equipment, power tools, portable electronics like laptop computers, secondary use of battery systems from various applications for electric grid stabilization, and more. The term "cell," as used herein, broadly includes any type of energy storage repeating node in an energy storage device and is not limited to any one particular embodiment. In the case of a high voltage battery used for vehicle propulsion, "cell" generally refers to a collection of one or more standard battery cells.

Figure 1:
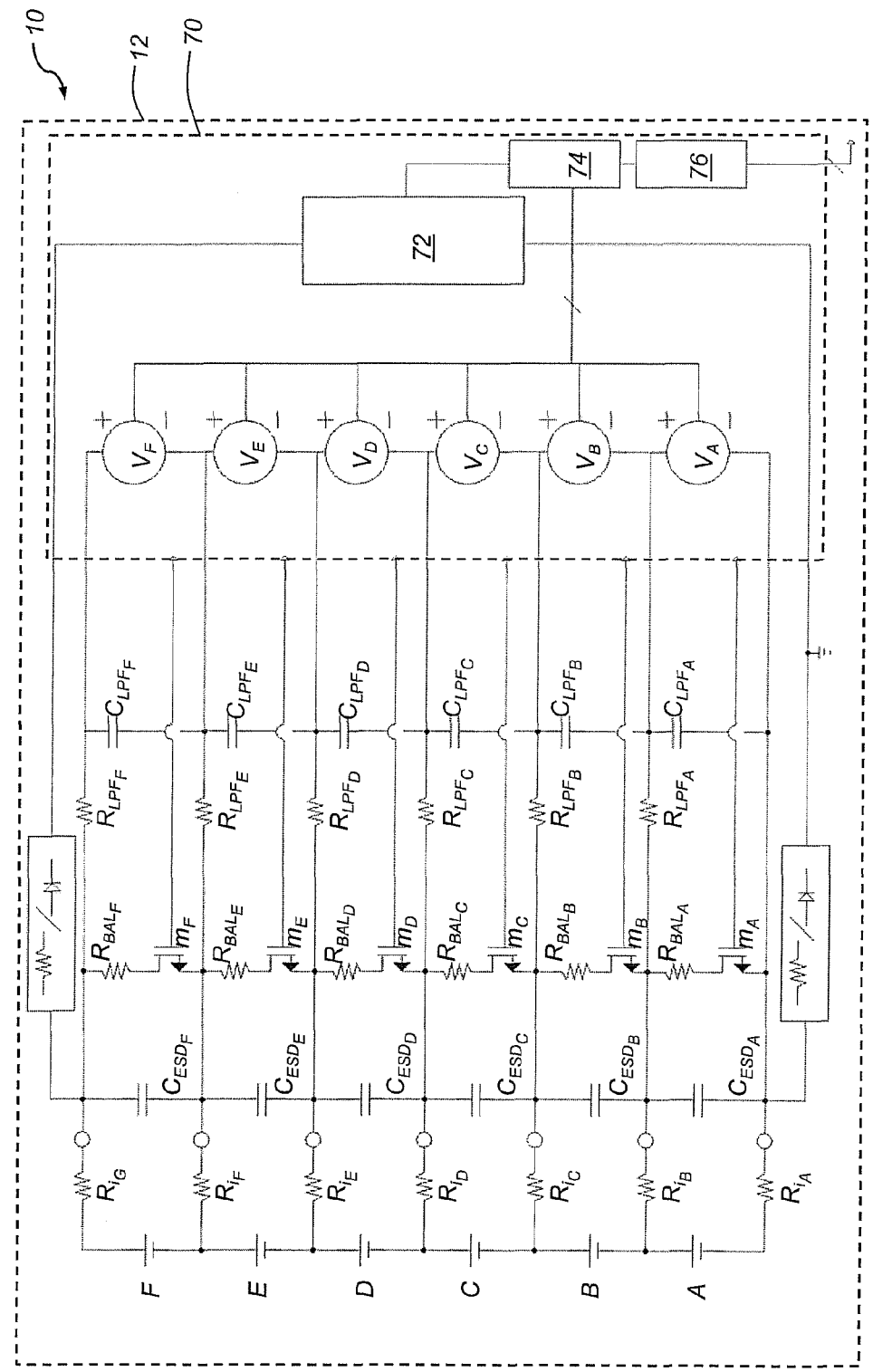
FIG. 1 is a schematic illustration of an exemplary sensor arrangement that may be used with an energy storage device, such as a vehicle battery.
Figure 2:
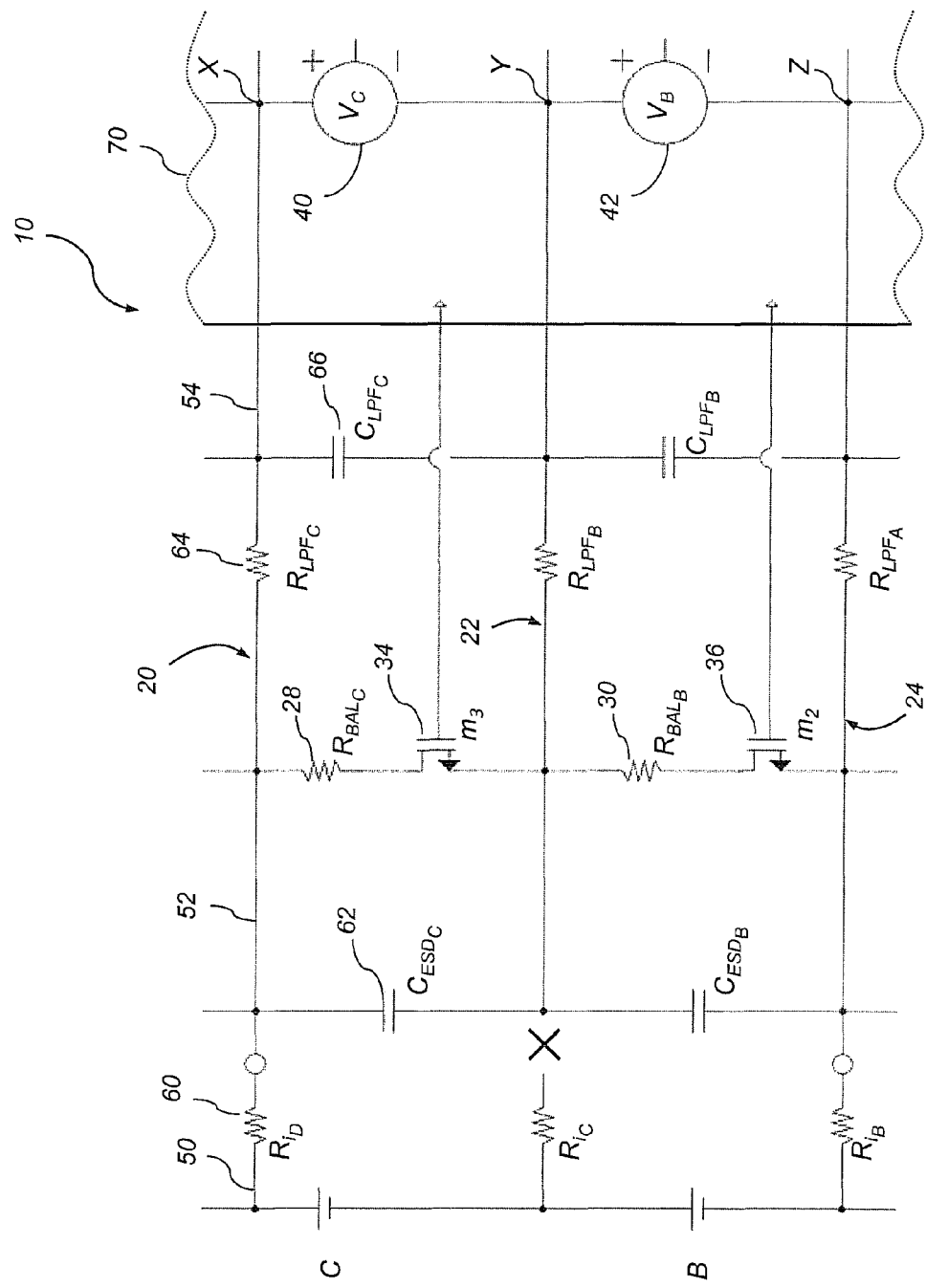
FIG. 2 is an enlarged view of a section of the exemplary sensor arrangement from FIG. 1.

With reference to FIGS. 1 and 2, there are shown schematic illustrations of an exemplary sensor arrangement 10 that may be used with a variety of different energy storage devices, including a vehicle battery pack 12 having a number of individual battery cells A, B, C, etc. FIG. 2 is a detailed or enlarged view of a section of exemplary sensor arrangement 10 and is provided to help illustrate some of the components of the sensor arrangement. The arrangement of components shown in FIG. 2 is generally representative of the overall sensor arrangement 10. Thus, the following description, which is provided in the context of FIG. 2, is applicable to the entire sensor arrangement shown in FIG. 1 as well.

According to the particular embodiment shown here, sensor arrangement 10 generally includes sensing wires 20-24, balancing resistors 28-30, balancing switches 34-36, sensor units 40-42, and a number of other electronic components. Sensor arrangement 10 is not limited to monitoring the various battery cells A-F; it may also perform other functions such as cell balancing. In one example of a cell balancing activity, balancing switches 34, 36 are used to bleed or otherwise reduce the charge on a particular battery cell or group of cells so that a relatively uniform charge can be maintained across battery pack 12. It should be appreciated that sensor arrangement 10 may have more or less sensor units than those shown in the exemplary drawings, and battery pack 12 may have more or less nodes, cells, etc. than those shown as well. Battery cells A-F may be part of a lithium-ion battery and may each have a voltage between 0-5 VDC, but this is not necessary.

Sensing wires 20-24 are the wires, traces and/or other connections that electrically couple the various battery cells to sensor units 40-42. In the exemplary embodiment shown in FIG. 2, sensing wire 20 refers to the entire connection between the positive terminal of battery cell C and the positive terminal of sensor unit 40, and includes a first wire section 50, a second wire section 52, and a third wire section 54. First wire section 52 electrically connects the positive terminal of battery cell C to the negative terminal of the adjacent battery cell D (not shown in FIG. 2) and to second wire section 52. An internal interconnect resistance is modeled or represented by resistor 60 and is typically on the order of about 0.01 mΩ; skilled artisans will appreciate that this internal interconnect resistor is not an actual resistive component, but rather is representative of an intrinsic resistance in the circuit. Second wire section 52 electrically connects first wire section 50 with an electric static discharge (ESD) capacitor 62 (e.g., $5 \times 10^{-11}$ F), cell balancing resistor 28 and another resistor 64. As demonstrated in FIG. 2, capacitor 62 is wired in parallel with battery cell C and the serial combination of cell balancing resistor 28 and cell balancing switch 34. Third wire section 54 electrically connects filtering resistor 64 (e.g., 500Ω) with a low pass filter capacitor 66 (e.g., $5 \times 10^{-8}$ F) and the positive terminal of sensor unit 40. A similar arrangement is provided for sensing wire 22, but that connection couples the negative terminal of battery cell C with the negative terminal of sensor unit 40, or the positive terminal of battery cell B with the positive terminal of sensor unit 42, depending on how one looks at it. The circuits for cells B and C share sensing wire 22 and its electronic components.

It is not necessary for the sensing wires 20-24 and the electrical components to be arranged in the exact layout shown in FIGS. 1 and 2, as many of the resistors and capacitors, for example, are simply provided for purposes of filtering or improving the sensor readings and could be provided differently. Moreover, even though sensing wires 20-24 and wire sections 50-54 are referred to as "wires," it should be understood that they could include traces on a printed circuit board (PCB) or the like or any other type of electrical connection and do not need to be in the form of traditional wires. Some of the electrical components shown in FIGS. 1-2, such as resistor 60, are not meant to represent actual physical components but rather internal characteristics of the circuit.

Balancing resistors 28-30 and balancing switches 34-36 may be used together to perform cell balancing as well as other functions. According to this particular embodiment, balancing resistor 28 is connected in series with balancing switch 34 such that when the switch is activated (i.e., when it is closed or turned "on"), a serial connection or path is formed between sensing wires 20 and 22. The gate of balancing switch 34 may be tied to an output pin of sensor circuit 70 (this may be the same sensor circuit that includes the various sensor units 40-42) so that the sensor circuit can control the state of the balancing switch. When sensor circuit 70 activates balancing switch 34 via its gate, charge from battery cell C may be bled or drained off via thermal energy loss through balancing resistor 28 (i.e., cell balancing). In an exemplary embodiment, the balancing resistors 28-30 are standard resistive elements with a resistance of about 80Ω and balancing switches 34-36 are N-channel MOSFET transistors. Skilled artisans will appreciate that a number of different techniques, components and/or arrangements may be employed to control the state of balancing switch 34, and that the present method is certainly not limited to any particular one.

Sensor units 40-42 can detect, measure, sense or otherwise determine different operational parameters of the battery cells to which they are connected. For example, sensor unit 40 may determine the voltage, current and/or temperature of battery cell C and, depending on the particular embodiment, may store those readings locally or send them to some other device. As mentioned in the preceding paragraph, sensor units 40-42 may be part of a larger sensor circuit 70 which can include not only the sensor units, but also a power supply 72, a logic unit 74 and a communication unit 76 (see FIG. 1). Sensor units 40-42 are not limited to any particular type of hardware or configuration, and may be provided with or without internal memory, with or without signal processing capabilities, and with or without complex communication functionality, to cite a few possibilities. In one embodiment, sensor units 40-42 act as voltage measurement channels and sensor circuit 70 is provided in the form of an application specific integrated circuit (ASIC) that is powered from the various battery cells themselves. This is only one example, however, as other embodiments could certainly be used instead.

Sensor arrangement 10 may be structured as a serial network (e.g., local interconnect network (LIN), controller area network (CAN), serial peripheral interface (SPI), FlexRay, RS485, etc.), as a parallel network, or as any other suitable wired or wireless network. This includes networks that use standard copper wires, circuit board traces, fiber optics, power connections and/or wireless channels to communicate. It is also possible for sensor arrangement 10 to be part of a first system, like a battery monitoring system, and for the first system to be connected to and communicate with one or more other systems in the vehicle, like an engine management system, etc. These are, of course, only some of the potential embodiments as sensor arrangement 10 may be used in any number of different networks, systems, configurations, architectures, etc. and is not limited to the particular example shown and described here.

If sensor arrangement 10 is operated without using the present method, certain scenarios could arise that may result in inaccurate readings. This is particularly true if there is a break or other disruption in one of the sensing wires 20-24, which is one of the more common fault scenarios with sensor arrangements like this. Consider the example where there is a break or other disruption in sensing wire 22, as illustrated in FIG. 2. The voltage at node Y may be undefined due to the open circuit, depending on the state of balancing switches 34, 36. Parasitic currents through the cell balancing portions and the measurement portions of sensor arrangement 10 can establish a weak resistive divider and thus the measured voltages at sensor units 40-42 may also be undefined due to the break in sensing wire 22. This is influenced by the fact that the measurement portions of sensor arrangement 10 have such high input impedances (e.g., filtering resistor 64, input impedance of sensor device 40, etc.) and that ESD capacitors 62 still hold some charge that depends on differences in the high impedance parasitics. Such conditions in a high impedance stacked voltage measurement circuit can result in an undefined response where the node being measured is floating. The exemplary break or disconnection in sensing wire 22 not only affects the measurement of battery cell C, but can also impact the measurement of battery cell B, as they share a common sensing wire. Therefore, simply measuring the voltage of battery cells C and B with sensor units 42 and 40 (e.g., when balancing switches 36 and 34 are turned off) may be insufficient when there are faults or other undesirable conditions in the circuit.

Figure 3:
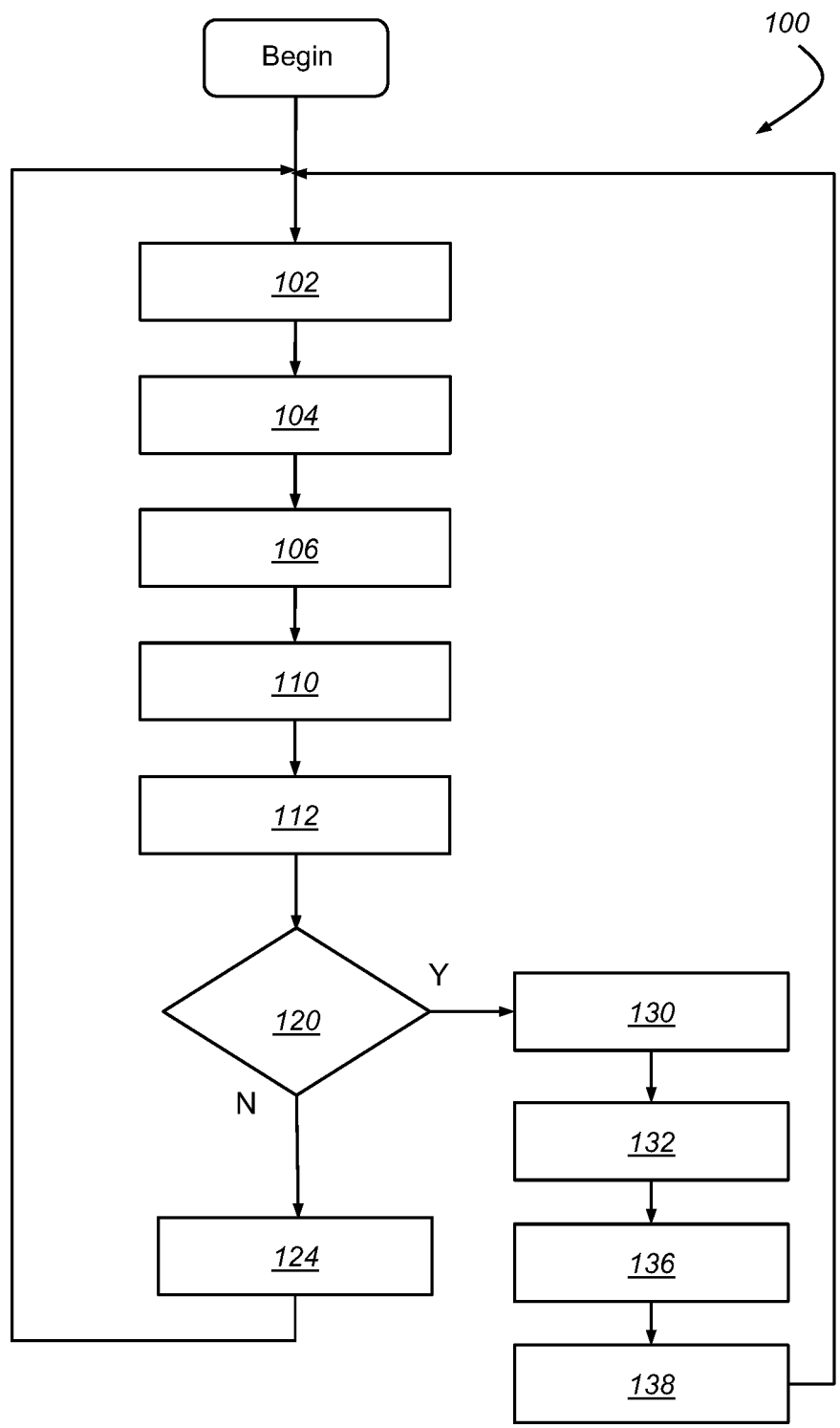
FIG. 3 is a flowchart of an exemplary method that may be used with a sensor arrangement, such as the exemplary sensor arrangement shown in FIG. 1.

Turning now to FIG. 3, there is shown an exemplary embodiment of a method 100 that may be used with a sensor arrangement like that shown in FIGS. 1 and 2. Generally speaking, exemplary method 100 may first detect a fault condition within the sensor arrangement and then remedy or address the fault condition. Method 100 is described in the following paragraphs in conjunction with FIGS. 4A-C, which are simplified schematics of the circuit shown in FIG. 2 (a number of the electrical components have been removed for purposes of clarity) and are simply provided to illustrate an exemplary condition where there is a break or other malfunction in sensing wire 22. The present sensor arrangement and method are not limited to such a schematic.

Figure 4A:
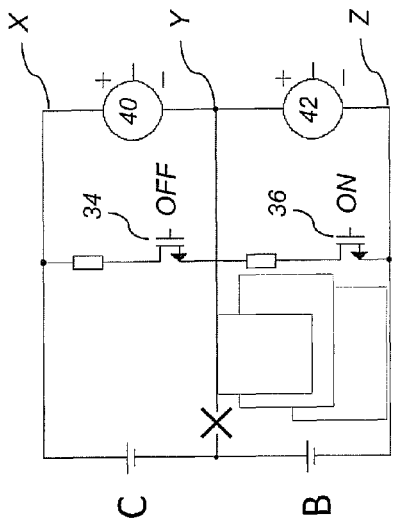
FIGS. 4A-D are schematic illustrations of sections of exemplary sensor arrangements and they are provided in conjunction with the description of the exemplary method shown in FIG. 3.
Figure 4B:
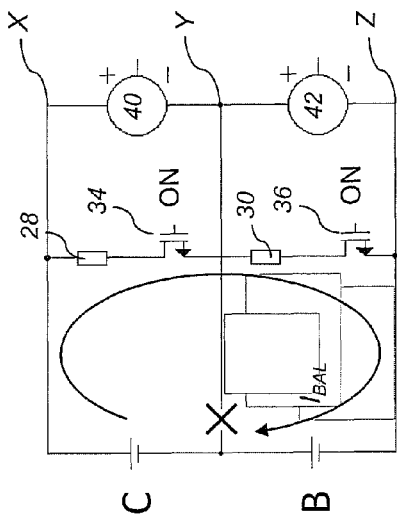
Figure 4C:
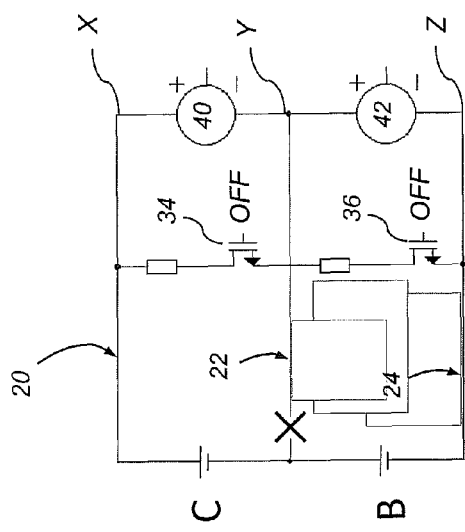

Beginning with step 102, the method first measures all of the cell voltages with all of the balancing switches turned off (e.g., balancing switches 34, 36, etc.); see FIG. 4A. In the example where a battery structure has six battery cells (like the sensor arrangement shown in FIG. 1 which has cells A-F), this produces six separate voltage readings. According to the illustration in FIG. 4A, the voltages seen by sensor units 40 and 42 both undefined due to the break in sensing wire 22 and thus the undefined voltage at node Y. Actual breaks or disconnections in the sensing wires are not the only fault conditions in sensor arrangement 10 that can affect accurate cell voltage measurements. For instance, the resistance $R_i$ of cell sensing wires may increase due to fretting, corrosion, loosening joints, etc. It is possible that sensor units 40 and/or 42 will measure voltage readings that are not patently false or obviously problematic at first glance, thus, additional analysis may be necessary to detect the break or fault condition in sensing wire 22.

Next, the method switches or changes the state of at least some of the balancing switches so that a first group of balancing switches is in an 'on' state and a second group is in an 'off' state, step 104. For instance, every other balancing switch could be turned 'on' so that a first half of the switches are closed and a second half of the switches are open. It is preferable that adjacent balancing switches be operated in different or opposite states (e.g., balancing switch 34 is "off" while balancing switch 36 is "on" and so on); see FIG. 4B. This results in an alternating sequence of 'on' and 'off' switches. If adjacent balancing switches are both operated in the same state where they are both 'on', then sensor units 40 and 42 will measure the average cell voltage for cells B and C; that is, they will act like a voltage divider instead of determining the actual voltage of cells B and C. This could lead to an inaccurate cell voltage reading and is a reason why it is preferable to operate them in an alternating sequence, as described above. The logic or software that governs which balancing switches to close and when to close them may reside in control circuit 70 or elsewhere.

With the first group of balancing switches closed or 'on' and the second group of balancing switches opened or 'off', step 106 may then measure or read at least some of the cell voltages. This may entail only reading the voltages for those battery cells where the corresponding balancing switch is closed or "on" (voltages $V_B$, $V_D$, $V_F$, etc. in the current example) or only reading the voltages for those battery cells where the corresponding balancing switch is opened or 'off' (voltages $V_A$, $V_C$, $V_E$, etc. in the current example), or it may entail reading the cell voltages for all of the battery cells, to cite several possibilities. In the example demonstrated in FIG. 4B where switch 34 is 'off' or open, switch 36 is 'on' or closed and there is a break in sensing wire 22, the voltage at node X is approximately $V_B+V_C$, the voltage at node Y is approximately 0, and the voltage at node Z is approximately 0. This results in sensor unit 40 measuring a voltage that is approximately equal to $V_B+V_C$ and sensor unit 42 measuring a voltage that is generally 0.

Next, step 110 switches or changes the state of at least some of the balancing switches. In the current example, step 110 may change the operational state of the first group of balancing switches from an 'on' condition to an 'off' condition and the operational state of the second group of balancing switches from an 'off' condition to an 'on' condition. Put differently, step 110 may swap the state of the balancing switches; if the odd switches had been 'on' and the even switches had been 'off,' now the odd switches are 'off' and the even switches are 'on'; see FIG. 4C. Controlling balancing switches independently may be important in that it enables method 100 to individually query or check the different sensing wires; if adjacent balancing switches were operated in the same state, for instance, then it may not be possible to diagnose their shared sensing wire. Other procedures and sequences for opening/closing or turning the switches on/off could be used instead.

With the operational states of the first and second groups of balancing switches flip-flopped, step 112 then measures or reads out the pertinent cell voltages. As stated above, it is possible for the method to measure only some of the cell voltages or to measure all of the cell voltages. In the current example with balancing switch 34 'on', balancing switch 36 'off', and sensing wire 22 having a break in its connection, the voltage at node X is approximately $V_B+V_C$, the voltage at node Y is approximately $V_B+V_C$, and the voltage at node Z is approximately 0. This results in sensor unit 40 measuring a voltage that is approximately 0 and sensor unit 42 measuring a voltage generally equal to $V_B+V_C$. Again, it is possible for step 112 to record cell voltages for each of the battery cells or only certain battery cells, such as the ones where their switches have been closed. At this point, at least three separate sets of cell voltage readings have been measured and stored; one set of cell voltage readings for the condition in FIG. 4A, one set for the condition in FIG. 4B, and one set for the condition in FIG. 4C. If sensors 40 and 42 do not have the ability to read the exact value of $V_B+V_C$ because this value exceeds the full scale measurement range of the sensors, then sensors with a greater scale measurement range may be used.

It should be appreciated that one or more of the preceding steps may measure or look at the state of the voltage readings as a function of time and not just when the switches are in discrete on/off states. Since filters may add a time constant, it is possible for method 100 to adjust or change the states of one or more switches and then wait or sample cell voltages multiple times in that state to make the detection. For example, cell voltages may trend toward 0, $V_B+V_C$ or some other value over time, based on the circuitry. Other techniques for measuring, sampling or otherwise determining voltage readings may certainly be used as well, as method 100 is not limited to any one technique.

Next, step 120 compares the voltage readings from step 102 (with all of the switches 'off' or open) to those obtained in steps 106 and 112 to determine if there is a fault condition. This comparison or evaluation may be performed in a number of different ways. One such way is to compare the difference between two readings for the same battery cell in order to see if they differ by more than an allowed tolerance; it is expected that small differences could exist in otherwise properly functioning circuits, and thus a certain margin of error should be built into the comparison. If the voltage readings for the same cell differ by a significant amount, it may indicate that there is a problem with those readings. Step 120 may also locate the fault condition by identifying adjacent cells that both have problematic voltage readings. In the example above, the voltage comparisons for battery cells B and C would indicate that there are problems with the readings for both cells; this, in turn, suggests that the fault condition lies somewhere along a shared connection, such as sensing wire 22. Again, other comparisons could be used in step 120. If no fault condition is detected, then the method simply proceeds to step 124 where the various cell voltage readings may be transmitted or sent to a component, device, module, system, etc. for further battery management processing. Some exemplary recipients of such cell voltage readings are a vehicle integration control module (VICM), a battery management system, as well as other vehicle control modules. Other components may receive and/or process the readings as well.

Figure 4D:
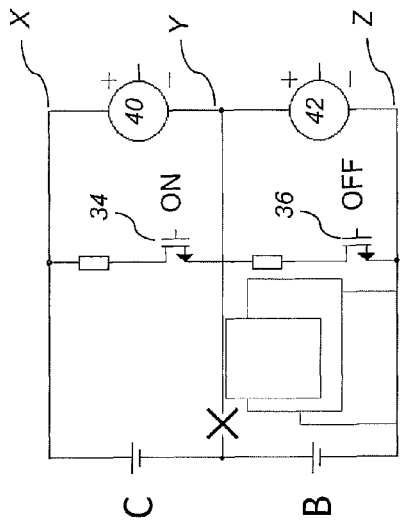

If a fault condition is detected, then the method proceeds to step 130 so that the fault can be resolved without having to bring the vehicle in for service or replacing the entire vehicle battery pack. As mentioned earlier, it is possible to view exemplary method 100 as being comprised of a fault detection section (steps 102-124) and a fault remediation section (steps 130-138). That is not to say that exemplary method 100 is necessarily partitioned into such clear and distinct sections, only that it may be possible for method 100 to perform both functions. If, for example, the voltage readings for battery cells B and C suggest that there is a fault condition with sensing wire 22, then step 130 may attempt to focus in and try and resolve this potential fault condition. One way to do this is to close or turn 'on' balancing switches 34 and 36 (see FIG. 4D), which are located above and below the suspected fault condition which, in this case, is a break or disconnect in sensing wire 22. This creates a balancing current $I_{BAL}$ that flows through battery cells B and C, through the upper balancing resistor/switch pair 28/34, through the lower balancing resistor/switch pair 30/36, and back to battery cell B. This creates a voltage divider that may be used by the method to estimate or otherwise determine the cell voltages for battery cells B and C, even though sensing wire 22 is experiencing a fault.

Step 132 measures or reads out the pertinent cell voltages. In one embodiment, step 132 uses sensor units 40 and 42 to determine the voltage drops between nodes X and Y as well as Y and Z. Skilled artisans will appreciate that the voltage readings gathered by sensor units 40 and 42 may be averaged estimates of the cell voltages for cells B and C. So long as the cell voltages for cells B and C are roughly the same as one another—which is typically the case because the cells in battery pack 12 are being periodically balanced or equalized—this estimate should be rather accurate. It is unlikely that two adjacent cells would have significantly different voltages at the same location where there is a break or fault condition (each scenario is unlikely, let alone the combined event).

It is also possible for step 132 to use the estimated cell voltages and knowledge of the resistance values of the various electrical components in the balancing current $I_{BAL}$ path (e.g., $R_{BAL1}$, $R_{ON1}$, $R_{BAL2}$, $R_{ON2}$, etc.) to determine the balancing current $I_{BAL}$. The balancing current $I_{BAL}$ may be a useful piece of information to sensor arrangement 10 and/or the battery electronics for one or more reasons; controlling cell balancing operations potentially being one of them. If this calculation is to be made, it is preferable that the various electrical components in the balancing current $I_{BAL}$ path be selected based on defined measurement accuracy or tolerance requirements.

Once the cell balancing and measurement tasks of the preceding step are complete, step 136 opens or turns 'off' balancing switches 34, 36 and returns the battery pack to a normal operating state. Step 138 may then transmit or otherwise send the cell voltage readings, the balancing current $I_{BAL}$ and/or any other suitable information to some component, module, system, etc. in the vehicle. In one example, step 136 sends the cell voltage readings and/or balancing current $I_{BAL}$ estimate to a vehicle integration control module (VICM) or battery management system for further processing. The number of potential energy management and other actions that such a module could take with such information is unlimited. For example, in this state the balance switches may be switched on for an extended time to equalize the cell changes; i.e., cell balancing. Any cell groups that were identified as having a break or fault condition, as described above, could be balanced as a pair during this time. Once this step is complete, method 100 may loop back to the beginning of the method for further monitoring.

It is to be understood that the foregoing description is not a definition of the invention, but is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. For example, the specific combination and order of steps in exemplary method 100 is just one possibility, as the present method may include a combination of steps that has fewer, greater or different steps than that shown here. All such other embodiments, changes, and modifications are intended to come within the scope of the appended claims. Again, the method described herein is not limited to any particular circuit arrangement or configuration, and could easily be used with sensor arrangement 10 or some other arrangement.

As used in this specification and claims, the terms "for example," "for instance," "such as," and "like," and the verbs "comprising," "having," "including," and their other verb forms, when used in conjunction with a listing of one or more components or other items, are each to be construed as open-ended, meaning that that the listing is not to be considered as excluding other, additional components or items. Other terms are to be construed using their broadest reasonable meaning unless they are used in a context that requires a different interpretation.

The invention claimed is:

1. A method of using a sensor arrangement with an energy storage device having a plurality of cells, comprising the steps of:
   (a) providing a sensor arrangement having a plurality of balancing switches, wherein each of the balancing switches is connected to a cell;
   (b) causing the plurality of balancing switches to be in an 'off' state and then measuring the voltages for at least some of the plurality of cells;
   (c) switching the state of at least some of the plurality of balancing switches so that a first group of balancing switches is in an 'on' state and a second group of balancing switches is in an 'off' state, and then measuring the voltages for at least some of the plurality of cells;
   (d) switching the state of at least some of the plurality of balancing switches so that the first group of balancing switches is in an 'off' state and the second group of balancing switches is in an 'on' state, and then measuring the voltages for at least some of the plurality of cells; and
   (e) comparing one or more of the voltages from step (b) with one or more of the voltages from steps (c) and/or (d) in order to determine if there is a fault condition.

2. The method of claim 1, wherein step (a) further comprises providing a sensor arrangement having a plurality of balancing switches and a plurality of balancing resistors, wherein each of the balancing switches is connected in series with a balancing resistor and the series-connected balancing switch and resistor combination is connected in parallel to a cell.

3. The method of claim 1, wherein step (c) further comprises switching the state of at least some of the plurality of balancing switches so that the plurality of balancing switches includes an alternating sequence of 'on' and 'off' balancing switches where adjacent balancing switches are operated in opposite states.

4. The method of claim 1, further comprising the step of:
   (f) transmitting cell voltage readings and/or a balancing current $I_{BAL}$ from the sensor arrangement to an electronic module located elsewhere in a vehicle.

5. The method of claim 1, wherein the method takes cell voltage measurements and performs cell balancing at the same time, and the cell balancing occurs across a two or more cells that share a faulted input wire.

6. The method of claim 1, wherein the energy storage device is a lithium-ion battery pack used for vehicle propulsion.

7. The method of claim 1, wherein step (e) further comprises comparing the voltage readings from step (b) with the voltage readings from steps (c) and/or (d), and determining that there is a fault condition when the compared voltage readings for the same cell differ by more than an allowed tolerance.

8. The method of claim 7, further comprising the step of:
   (f) locating the fault condition by identifying two adjacent cells that both have compared voltage readings that suggest a fault condition.

9. The method of claim 1, further comprising the step of:
   (f) resolving the fault condition by locating the fault condition and estimating the voltages for first and second cells that are adjacent one another and are both connected to the fault condition.

10. The method of claim 9, wherein step (f) further comprises resolving the fault condition by causing first and second balancing switches that are adjacent one another and are connected to the first and second cells to be in an 'on' state, and then measuring the voltages for the first and second cells.

11. The method of claim 9, wherein step (f) further comprises determining a balancing current $I_{BAL}$ that flows through the first and second cells.

12. A method of using a sensor arrangement with an energy storage device having a plurality of cells, comprising the steps of:
   (a) providing a sensor arrangement having a plurality of balancing switches, wherein each of the balancing switches is connected to a cell;
   (b) determining if there is a fault condition with the energy storage device; and
   (c) if there is a fault condition with the energy storage device, then locating the fault condition and estimating a voltage for a first cell and a second cell, wherein the first and second cells are together connected to a shared connection in which the fault condition lies.

13. The method of claim 12, wherein step (a) further comprises providing a sensor arrangement having a plurality of balancing switches and a plurality of balancing resistors, wherein each of the balancing switches is connected in series with a balancing resistor and the series-connected balancing switch and resistor combination is connected in parallel to a cell.

14. The method of claim 12, wherein step (c) further comprises locating the fault condition by identifying two adjacent cells that both have compared voltage readings that suggest a fault condition.

15. The method of claim 12, further comprising the step of:
   (d) transmitting cell voltage readings and/or a balancing current $I_{BAL}$ from the sensor arrangement to an electronic module located elsewhere a vehicle.

16. The method of claim 12, wherein the method takes cell voltage measurements and performs cell balancing at the same time, and the cell balancing occurs across a two or more cells that share a faulted input wire.

17. The method of claim 12, wherein the energy storage device is a lithium-ion battery pack used for vehicle propulsion.

18. The method of claim 12, wherein step (b) further comprises determining if there is a fault condition with the energy storage device by performing the following steps:
   (i) causing the plurality of balancing switches to be in an 'off' state and then measuring the voltages for at least some of the plurality of cells;
   (ii) switching the state of at least some of the plurality of balancing switches so that a first group of balancing switches is in an 'on' state and a second group of balancing switches is in an 'off' state, and then measuring the voltages for at least some of the plurality of cells;
   (iii) switching the state of at least some of the plurality of balancing switches so that the first group of balancing switches is in an 'off' state and the second group of balancing switches is in an 'on' state, and then measuring the voltages for at least some of the plurality of cells; and
   (iv) comparing the voltages from steps (i), (ii) and (iii) in order to determine if there is a fault condition with the energy storage device.

19. The method of claim 18, wherein step (iii) further comprises switching the state of at least some of the plurality of balancing switches so that the plurality of balancing switches includes an alternating sequence of 'on' and 'off' balancing switches where adjacent balancing switches are operated in opposite states.

20. The method of claim 18, wherein step (iv) further comprises comparing the voltage readings from step (i) with the voltage readings from steps (ii) and/or (iii), and determining that there is a fault condition when the compared voltage readings for the same cell differ by more than an allowed tolerance.

21. The method of claim 12, wherein step (c) further comprises estimating a voltage for the first cell and the second cell by causing first and second balancing switches that are adjacent one another and are connected to the first and second cells to be in an 'on' state, and then measuring the voltages for the first and second cells.

22. The method of claim 21, wherein step (c) further comprises determining a balancing current $I_{BAL}$ that flows through the first and second cells.

* * * * *